United States Patent [19]

Matsumoto et al.

[11] Patent Number: 4,769,750
[45] Date of Patent: Sep. 6, 1988

[54] ILLUMINATION OPTICAL SYSTEM

[75] Inventors: Koichi Matsumoto; Makoto Uehara; Tetsuo Kikuchi, all of Tokyo, Japan

[73] Assignee: Nippon Kogaku K. K., Tokyo, Japan

[21] Appl. No.: 918,131

[22] Filed: Oct. 14, 1986

[30] Foreign Application Priority Data

Oct. 18, 1985 [JP] Japan .................. 60-232845
Oct. 18, 1985 [JP] Japan .................. 60-232846

[51] Int. Cl.[4] .................. F21V 7/04; G03B 21/14
[52] U.S. Cl. .................. 362/268; 350/167; 353/38
[58] Field of Search .................. 362/268; 350/167; 353/38, 65, 97, 122, 98, 63, 39; 355/67, 71

[56] References Cited

U.S. PATENT DOCUMENTS

| 2,272,945 | 2/1942 | Hotchner | 353/38 X |
| 2,326,170 | 8/1943 | Räntsch | 353/38 |
| 3,296,923 | 1/1967 | Miles | 88/24 |
| 3,302,016 | 1/1967 | Larraburu | 353/38 X |
| 3,923,389 | 12/1975 | Rogers et al. | 353/38 |
| 3,941,475 | 3/1976 | Sheets | 355/78 |
| 4,082,438 | 4/1978 | Knop | 353/38 X |
| 4,497,015 | 1/1985 | Konno et al. | 362/268 |
| 4,619,508 | 10/1986 | Shibuya et al. | 362/268 X |
| 4,648,695 | 3/1987 | Mizutani et al. | 353/38 X |

Primary Examiner—Larry Jones
Attorney, Agent, or Firm—Shapiro and Shapiro

[57] ABSTRACT

An illumination optical system comprises a multi-beam generator which includes a plurality of each of two kinds of lens elements different in optical characteristics and which is interposed between a source for generating a collimated light beam and a light condenser. The multi-beam generator generates a large number of secondary light sources from the collimated light beam. The illumination optical system is capable of supplying illuminating light rays having an extremely uniform illumination distribution.

11 Claims, 3 Drawing Sheets

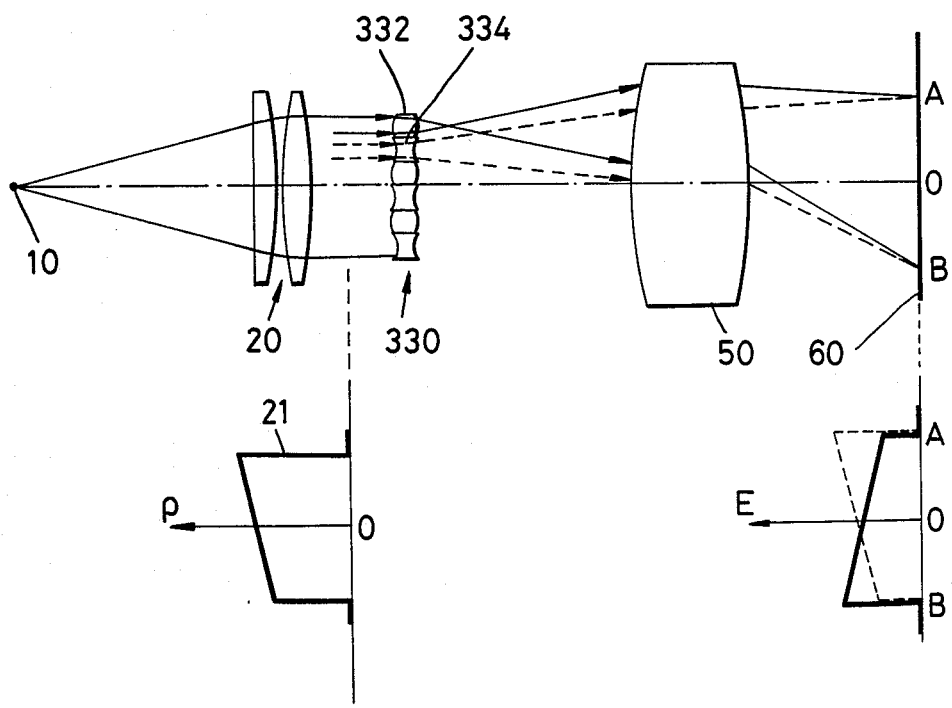

ILLUMINATION OPTICAL SYSTEM

BACKGROUND OF THE INVENTION

1. Field of the Invention

The present invention relates to an illumination device for supplying light having a uniform illumination distribution and more particularly to an optical system having such a device.

2. Related Background Art

Illumination devices capable of supplying light rays having a flat illumination distribution are needed for a variety of applications. Examples include in exposure devices of the type for projecting a pattern on a semiconductor wafer, thereby printing the pattern of IC or LSI; photo-chemical vapor deposition (CVD) devices of the type for using ultraviolet rays or a laser beam to cause the reaction between a silicon compound and an oxidizing gas, thereby forming a $SiO_2$ film over the surface of a substrate; and laser annealing devices of the type for irradiating the surface of an ion injected semiconductor, thereby recovering the damages of the surface and other apparatus for the fabrication of semiconductor devices.

As disclosed, for instance, in U.S. Pat. Nos. 3,296,923 and 3,941,475, it is well known that for supplying such illuminating light rays, a pair of series lenticular matrices may be used to produce a large number of secondary light sources from a collimated light beam emitted from an elliptic mirror.

Furthermore, as disclosed in U.S. Pat. No. 4,497,015, it is also known to dispose in series a plurality of optical integrators each of which functions like the above-described series lenticular matrix, thereby further improving the illumination distribution.

Light from a plurality of secondary light sources produced by a multi-beam generator such as a pair of lenticular matrices or optical integrators as described above, may be overlapped at an object surface through the use of a condenser lens so that illumination is averaged and smoothed.

In the illumination devices of the types described above, the multi-beam generator is composed of a plurality of lens elements having the same focal length and the same magnification between the incidence surface and the object surface. It follows therefore that if the intensity distribution (more correctly the beam density distribution) of the light rays impinging on the multi-beam generator is symmetrical about the center of the beam, then a uniform illumination distribution can be obtained over the object surface. However, if the light impinging on the multi-beam generator has an asymmetric beam density distribution, it becomes impossible to cancel the inclined components (gradient) of the beam density distribution. As a result, the inclination of the illumination distribution carries over to the object surface and consequently there arises the problem that a uniform illumination cannot be obtained.

Asymmetric beam density distribution is a phenomenon which is often observed with light sources, a most noteworthy example being the excimer laser, which has been lately attracting considerable attention.

SUMMARY OF THE INVENTION

In view of the above, one of the objects of the present invention is to provide an illumination optical system capable of supplying illuminating light rays having an extremely uniform illumination distribution.

Another object of the present invention is to provide an illumination optical system which, even when the collimated beam emitted from a light source means has an asymmetric beam density distribution, can correct the asymmetric beam density distribution so that the object surface can be illuminated with a uniform illumination distribution.

An illumination optical system in accordance with the present invention comprises a multi-beam generator which includes a plurality of each of two kinds of lens element different in optical characteristics. The generator is interposed between a means for generating a collimated light beam and a light condenser means. The multi-beam generator generates a large number of secondary light sources from the collimated light beam.

According to one aspect of the present invention, the multi-beam generator includes a first multi-beam generator in the form of a combination consisting of a plurality of first afocal lens element with an angular magnification of minus 1 and a plurality of second afocal lens elements having an angular magnification of plus 1, and a second multi-beam generator consisting of a plurality of lens element each having the same focal length.

The collimated light impinging on each first lens element of the first multi-beam generator has its light path inverted in relation to the optical axis of the first lens element and is emitted toward the second multi-beam generator. The path of the collimated light incident on each second lens element of the first multi-beam generator is not inverted, and the light passes through the second lens element and is emitted toward the second multi-beam generator.

As a result, the light density distribution produced by the first lens elements is the inverse of that produced by the second lens elements. It follows therefore when the construction ratio of the first lens element is substantially equal to that of the second, the gradient of the density distribution of the collimated beam is canceled, whereby uniform illumination distribution can be obtained over the object surface.

According to a second aspect of the present invention, the multi-beam generator comprises a combination of a plurality of first lens elements having a positive focal length and a plurality of second lens elements having a negative focal length.

Again, the path of the collimated beam impinging on each of said first lens elements is inverted, but that of the collimated light beam incident on each of the second lens element is not.

BRIEF DESCRIPTION OF THE DRAWINGS

FIG. 6 is a schematic view of an optical system of a second embodiment of the present invention.

DESCRIPTION OF THE PREFERRED EMBODIMENT

Figure 1:
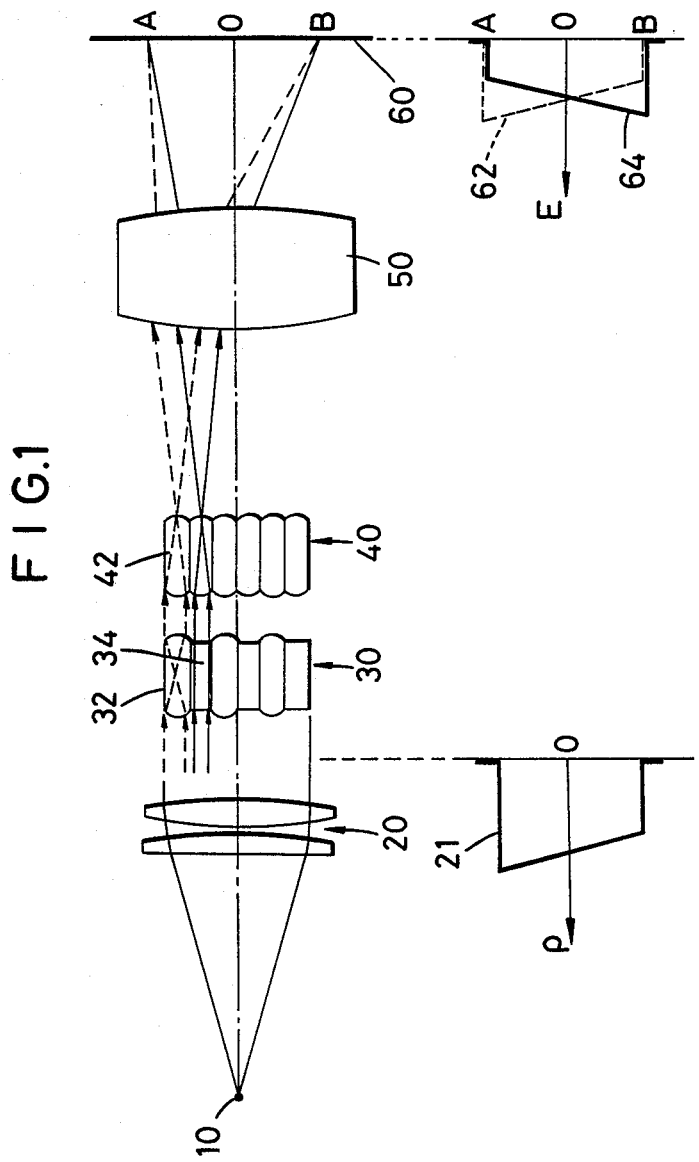
FIG. 1 is a schematic view of an optical system of a first embodiment of an illumination device in accordance with the present invention.

FIG. 1 shows schematically an illumination optical system of a first embodiment of the present invention.

The light beam emitted from a light source or an image of a light source 10 is collimated by a collimation lens 20. A first multi-beam generator 30 and a second multi-beam generator 40 are disposed in series along the optical axis O in the path of the beam and a condenser 50 is interposed between the second multi-beam generator 40 and an object surface 60.

The first multi-beam generator 30 is in the form of a combination of a plurality of first afocal lens elements 32 having an angular magnification of minus 1 and a plurality of second afocal lens elements 34 having an angular magnification of plus 1, the first and second elements 32 and 34 being alternately disposed. The angular magnification refers to the ratio between the width of the incident light beam and the width of the emerging light beam.

The first lens elements 32 is a biconvex lens and the front or incidence convex surface and the rear or exit convex surface define a so-called Kepler type afocal system having the same magnification. The second lens element 34 is in the form of a parallel flat prism whose front and rear surfaces are flat.

Figure 2:
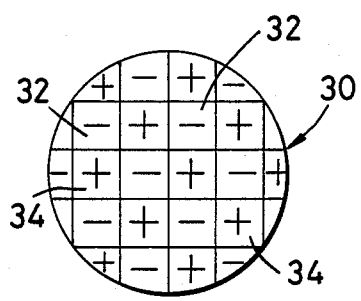
FIG. 2 shows on an enlarged scale a cross section of a first multi-beam generator in a plane perpendicular to the optical axis thereof.

As best shown on an enlarged scale in FIG. 2, the first and second lens elements 32 and 34 have a square cross sectional configuration in a plane perpendicular to the optical axis and they are alternately disposed in the horizontal, vertical and oblique directions. However, it should be noted that the present invention is not limited to the above-described cross sectional configuration or the arrangement of the first and second lens elements 32 and 34 and that, as shown in FIG. 3, the first and second lens elements 32 and 34 may have a hexagonal cross sectional configuration and may be arranged at random.

When the first and second lens elements 32 and 34 are arranged alternately as shown in FIG. 2, they have substantially the same number, but it is preferable that even when the first and second lens elements 32 and 34 are arranged at random, they are substantially the same in number.

Figure 3:
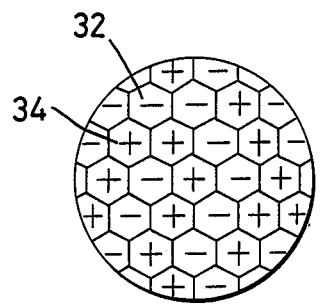
FIG. 3 shows a modification of the cross sectional configuration perpendicular to the optical axis of the first multi-beam generator.

In FIGS. 2 and 3, the symbols "+" and "−" represent the angular magnifications.

The second multi-beam generator 40 is composed of a plurality of lens elements 42 each having the same focal length. Each element 42 is disposed in opposed relationship with a corresponding first or second lens elements 32 or 34 of the first multi-beam generator 30. The cross sectional configuration of the lens elements 42 is substantially similar to that of the first and second lens elements 32 and 34 of the first multi-beam generator 30. That is, when the first multi-beam generator 30 is so designed and constructed as shown in FIG. 2, the lens elements 42 of the second multi-beam generator 40 have a square cross sectional configuration. In like manner, when the first multi-beam generator 30 is so designed and constructed as shown in FIG. 3, the lens elements 42 have a hexagonal cross sectional configuration.

In the illumination optical system with the above-described construction, the light beam emerging from the collimation lens 20 impinges on the first multi-beam generator 30 and the light rays which have passed through the first or second lens elements 32 or 34 impinge on corresponding lens elements 42 of the second multi-beam generator 40. The light rays which have passed through the lens elements 42 pass through a condenser lens 50 and fall on the object surface 60. As a result, the region of the object surface 60 defined between the points A and B is illuminated by the light beams in an overlapping manner.

In FIG. 1, the light rays which pass through the first lens elements 32 are indicated in broken line while the light rays which pass through the second element lens 34 are indicated by solid line.

Furthermore, in FIG. 1, the beam density distribution $\rho$ of the collimated light beam passing through the collimation lens 20 is indicated by 21 while two characteristics of the illumination distribution over the object surface 60 are indicated by 62 and 64, respectively. The illumination distribution over the object surface 60 due to the light beams passing through the first lens elements 32 is indicated by 62 (broken lines) while the illumination distribution over the object surface 60 due to the light beams passing through the second lens elements 34 is indicated by 64 (solid lines).

It will be seen that the ray arrangement of the collimated light impinging on each first lens element 32 is inverted once within that lens element and then the light, so inverted, impinges on the corresponding element 42 of the second multi-beam generator 40 while maintaining the collimated state. Therefore a secondary light source is created at the light exit surface of each corresponding lens element 42 and the light beams emitted from the respective secondary light sources pass through the condenser lens 50 and illuminate the region A–B of the object surface 60.

It follows therefore that the illumination distribution over the object surface 60 due to the light beams passing through the first lens elements 32 has a gradient or inclination the same as that of the beam-density distribution of the light beam emerging from the collimation lens 20.

On the other hand, the ray arrangement of the collimated light incident on each second lens element 34 is not inverted and emerges therefrom and impinges on the corresponding lens elements 42 of the secondary multi-beam generator 40. A second light source is thus created at the exit surface of each such corresponding element 42 and the light beams emitted from the secondary light sources pass through the condenser lens 50 and illuminate the region A–B of the object surface 60.

Therefore the illumination distribution over the object surface 60 due to the light beams passing through the second lens elements 34 has a gradient or inclination opposite to that of the beam density distribution of the light emerging from the collimation lens 20.

As described above, the respective gradients or inclinations of the illumination distributions over the object surface 60 due to the light beams passing through the first and second lens elements 32 and 34, are opposite. Therefore when the first and second lens elements 32 and 34 are arranged almost equal in number, a uniform illumination distribution over the object surface 60 can be obtained.

It will be appreciated that, when the first multi-beam generator 30 is inclined at an angle relative to the optical axis O, there is a possibility that light will be reflected by the inner wall surfaces of the second lens elements 34 such reflected light beams may adversely affect uniformity of the illumination distribution. This problem can be avoided by the arrangement as shown in FIG. 4.

Figure 4:
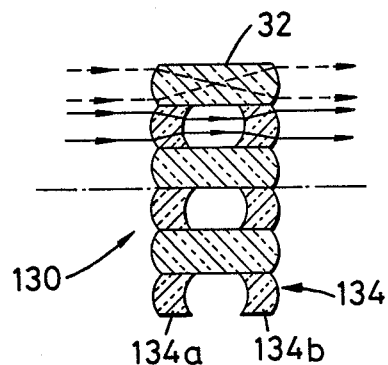
FIG. 4 shows in cross section along the optical axis a modification of a first multi-beam generator.

In the arrangement as shown in FIG. 4, each of the second lens elements 134 of the first multi-beam generator 130 consists of two meniscus lenses 134a and 134b. Therefore, when the collimated light beam impinges on the second lens element 134, its width is reduced by the meniscus lens 134a and then the reduced width is restored to the original width through the meniscus lens 134b. The two meniscus lenses 134a and 134b are substantially similar in construction and are disposed in opposed relationship with each other. The convex and concave surfaces of each meniscus lens define the so-called Galileo type afocal system.

Figure 5:
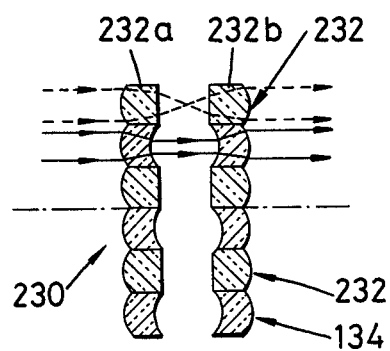
FIG. 5 is a similar sectional view of another modification of a first multi-beam generator.

The first lens element 32 as shown in FIGS. 1 and 4 has a focal point within the lens 32. As a result, when a light source having a high output is used, there is a danger that the lens element will be damaged due to heating. However, this problem may be avoided by the arrangement as shown in FIG. 5. As shown therein, each first element lens 232 of the first multi-beam generator 230 comprises two planoconvex lenses 232a and 232b which have the same construction, and the second element lens 134 is substantially similar to that described above with reference to FIG. 4. With this arrangement, the focal point of the first lens element lies in the space defined by the two positive lenses 232a and 232b so that there is no danger of thermal breakdown.

It is to be understood that the foregoing concept is not limited to the two positive lenses constituting the first lens element 232. Nor is it necessary that the lenses 232a and 232b have the same construction. The same is true for the second element lenses shown in FIGS. 4 and 5. It is especially important that the second lens elements be afocal as a whole but it is not essential that each lens 134a or 134b be afocal.

In the above-described embodiments, there is a one-to-one correspondence between respective lens element of the first and second multi-beam generators, but the present invention is not limited thereto. For instance, one lens element of the first multi-beam generator may be disposed in opposed relationship with a plurality of lens element in the second multi-beam generator.

Next referring to FIG. 6, a second embodiment of an illumination optical system in accordance with the present invention will be described. The light emitted from a light source 10 is collimated by a collimation lens 20 and impinges on a multi-beam generator 330.

The multi-beam generator 330 comprises a plurality of first lens element 332 each having a positive focal length and a plurality of second lens element 334 each having a negative focal length, the first and second elements 332 and 334 being alternately or randomly arranged.

Each of the first lens elements 332 converges the incident collimated light rays along the optical path. The light-ray distribution over the incidence surface of each first lens element 332 is thus opposite to the light-ray distribution on the light-incidence surface of a condenser lens 50 with respect to the optical axis of the first element lens 332. As a result, the gradient or inclination of the beam density distribution of the collimated light beam indicated by the reference numeral 21 is opposite to the gradient or inclination of the illumination distribution over the object surface 60 due to the light beams passing through the first lens elements 332, indicated by the solid lines at E.

The collimated light incident on each of the second lens element 334 is not converged therein and passes through the condenser lens 50 to illuminate the object surface 60. Therefore, the gradient or inclination of the illumination distribution E over the object surface 60 due to the light beams passing through the second lens elements 334 is the same as that of the beam density distribution $p$ of the collimated light beam as indicated by the broken lines.

In the second embodiment, the two multi-beam generators used in the first embodiment are combined into a single multi-beam generator so that a uniform illumination distribution can be attained over the object surface 60 as a whole.

In both the first and second embodiments, the ratio in number between the first lens element 32, 232 or 332 and the second lens elements 34, 134 or 334 may be suitably selected depending on the beam density distribution of the collimated light beam. For instance, the ratio between the first and second element lenses may be varied from one part to another in the multi-beam generator so that a more uniform illumination distribution can be attained over the object surface.

What is claimed is:

1. An illumination optical system comprising:
   means for emitting a collimated light beam along an optical axis of said optical system;
   multi-beam generator means for dividing said collimated light beam into a plurality of regions in a plane crossing said collimated light beam and defining a plurality of optical paths corresponding to said plurality of regions,
   said multi-beam generator means including a lens assembly in which a plurality of first lens elements each having a positive focal length and a plurality of second lens elements each having a negative focal length are arranged at said plane in an intermingled manner; and
   optical means for directing the light travelling in said plurality of optical paths to a predetermined region on an object surface.

2. An illumination optical system comprising:
   means for emitting a collimated light beam along an optical axis of said optical system;
   multi-beam generator means disposed in the path of said light beam for producing multiple beams therefrom; and
   means for directing said beams to a predetermined region of an object surface,
   said multi-beam generator means including an array of inverting optical elements and non-inverting optical elements disposed in parallel in the path of said light beam for producing, respectively, at said object surface, an illumination distribution having a gradient and an illumination distribution having an opposite gradient.

3. An illumination optical system comprising:
   means for emitting a collimated light beam along an optical axis of said optical system;
   multi-beam generator means for dividing said collimated light beam into a plurality of regions in a plane crossing said collimated light beam and defining a plurality of optical paths corresponding to said plurality of regions;
   said multi-beam generator means including a first lens assembly in which a plurality of afocal first lens elements each having an angular magnification of minus 1 and a plurality of afocal second lens elements each having an angular magnification of plus 1 are arranged at said plane in an intermingled manner, and a second lens assembly which includes a plurality of lens elements each having substantially the same focal length; and optical means for directing the light travelling in said plurality of optical paths to a predetermined region on an object surface.

4. An illumination optical system comprising:

means for emitting a collimated light beam along an optical axis of said optical system, said collimated light beam having a beam density distribution;

multi-beam generator means for dividing the collimated light beam into a plurality of regions in a plane passing through said collimated light beam and defining a plurality of optical paths of a first type and a plurality of optical paths of a second type, each optical path extending along said optical axis and corresponding to a respective one of said regions; and optical means for directing the parts of said light beam travelling in the respective optical paths to a predetermined region of an object surface, said multi-beam generator means including a plurality of first optical elements arranged at said plane and defining said first type optical paths and a plurality of second optical elements arranged at said plane and defining said second type optical paths, each of said first optical elements having an optical characteristic such that the parts of said light beam travelling in said first type optical paths interact with said optical means so as to irradiate said region of said object surface with a first illumination distribution corresponding to said beam density distribution, each of said second optical elements having an optical characteristic such that the parts of said light beam travelling in said second type optical paths interact with said optical means so as to irradiate said region of said object surface with a second illumination distribution which is opposite to said first illumination distribution with respect to said optical axis.

5. An illumination optical system comprising:

means for emitting a collimated light beam along an optical axis of said optical system;

multi-beam generator means for dividing said collimated light beam into a plurality of regions in a plane crossing said collimated light beam and defining a plurality of optical paths of a first type and a plurality of optical paths of a second type, each optical path extending along said optical axis and corresponding to a respective one of said regions;

said multi-beam generator means having a plurality of first optical elements arranged at said plane and defining said first type optical paths and a plurality of second optical elements arranged at said plane and defining said second type optical paths;

each first optical element having an optical characteristic such that it inverts the arrangement of rays in the part said collimated light beam incident thereon, each second optical element having an optical characteristic such that it passes the part of said collimated light beam incident thereon without such inversion; and optical means for directing the light travelling in said plurality of optical paths to a predetermined region on an object surface.

6. An illumination optical system as set forth in claim 5 wherein said multi-beam generator means comprises a first lens assembly in which a plurality of afocal first lens elements each having an angular magnification of minus 1 and a plurality of afocal second lens elements each having an angular magnification of plus 1 are arranged in an intermingled manner, and a second lens assembly which includes a plurality of lens elements each having substantially the same focal length is interposed between said first lens ssembly and said optical means.

7. An illumination optical system as set forth in claim 6 wherein said first lens assembly and said second lens assembly are arranged in series along the optical axis of said optical system.

8. An illumination optical system as set forth in claim 6 wherein each of said first lens elements of said first lens assembly includes a first positive lens and a second positive lens arranged in series with one another in parallel with said optical axis and the secondary (rear) focal point of the first positive lens coincides with the primary (front) focal point of the second positive lens.

9. An illumination optical system as set forth in claim 6 wherein each of said second lens elements of said first lens assembly includes a first meniscus lens and a second meniscus lens which are arranged in series with one another in parallel with said optical axis such that the concave surfaces of said first and second meniscus lenses are in opposed relationship with each other.

10. An illumination optical system as set forth in claim 5 wherein said multi-beam generator means includes a lens assembly in which a plurality of first lens elements each having a positive focal length and a plurality of second lens elements each having a negative focal length are arranged in an intermingled manner.

11. An illumination optical system as set for in claim 5 wherein each of said first and second type optical paths constitutes one half of said plurality of optical paths.

* * * * *